United States Patent
Ichino et al.

(10) Patent No.: US 11,315,759 B2
(45) Date of Patent: Apr. 26, 2022

(54) PLASMA PROCESSING APPARATUS

(71) Applicant: HITACHI HIGH-TECH CORPORATION, Tokyo (JP)

(72) Inventors: Takamasa Ichino, Tokyo (JP); Kohei Sato, Tokyo (JP); Kazunori Nakamoto, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/646,696

(22) PCT Filed: Feb. 8, 2019

(86) PCT No.: PCT/JP2019/004749
§ 371 (c)(1),
(2) Date: Mar. 12, 2020

(87) PCT Pub. No.: WO2020/161919
PCT Pub. Date: Aug. 13, 2020

(65) Prior Publication Data
US 2021/0233744 A1 Jul. 29, 2021

(51) Int. Cl.
*H01J 37/32* (2006.01)

(52) U.S. Cl.
CPC ..... *H01J 37/32183* (2013.01); *H01J 37/3211* (2013.01); *H01J 37/3244* (2013.01);
(Continued)

(58) Field of Classification Search
CPC ............. H01J 37/32183; H01J 37/3211; H01J 37/3244; H01J 37/32577; H01J 37/32642;
(Continued)

(56) References Cited

U.S. PATENT DOCUMENTS

| 5,103,367 | A | 4/1992 | Horwitz et al. |
| 6,768,079 | B2 | 7/2004 | Kosakai |

(Continued)

FOREIGN PATENT DOCUMENTS

| JP | H02503376 A | 10/1990 |
| JP | 2007173596 A | 7/2007 |

(Continued)

OTHER PUBLICATIONS

Office Action dated May 6, 2021 in Korean Application No. 10-2020-7004960.

(Continued)

*Primary Examiner* — Renan Luque
(74) *Attorney, Agent, or Firm* — Miles & Stockbridge, P.C.

(57) ABSTRACT

A plasma processing apparatus includes a processing chamber in which a wafer 1 is processed by using plasma, a radio-frequency power supply that supplies radio-frequency power for generating the plasma, a sample table 2 which is arranged in the processing chamber and in which the wafer 1 is mounted, and a DC power supply 106 which is electrically connected to the sample table 2 and which causes the sample table 2 to generate a suction force. The sample table 2 includes a protruded portion 201*a* that sucks the wafer 1 by the suction force and a level different portion 201*b* protruding from a lower portion of the protruded portion 201*a*. A ring 5 that can be in contact with a lower surface of the wafer 1 is provided outside the protruded portion 201*a*. A space portion 7 formed by the wafer 1, the protruded portion 201*a*, and the ring 5 is sealed in a state in which the wafer 1 is sucked to an upper surface of the protruded portion 201*a* of the sample table 2.

10 Claims, 6 Drawing Sheets

(52) U.S. Cl.
CPC .. *H01J 37/32577* (2013.01); *H01J 37/32642* (2013.01); *H01J 37/32715* (2013.01)

(58) Field of Classification Search
CPC ........... H01J 37/32715; H01J 37/32724; H01J 37/32532; H01L 21/3065; H01L 21/683; H01L 21/6833
See application file for complete search history.

(56) References Cited

U.S. PATENT DOCUMENTS

| | | |
|---|---|---|
| 2007/0146961 A1 | 6/2007 | Morioka et al. |
| 2009/0014323 A1 | 1/2009 | Yendler et al. |
| 2009/0044751 A1 | 2/2009 | Park et al. |
| 2010/0326957 A1 | 12/2010 | Maeda et al. |
| 2011/0126984 A1 | 6/2011 | Kang et al. |
| 2012/0160808 A1 | 6/2012 | Kikuchi et al. |
| 2012/0238040 A1 | 9/2012 | Kubota et al. |
| 2014/0213055 A1* | 7/2014 | Himori ............. H01L 21/67063 438/689 |
| 2014/0367047 A1* | 12/2014 | Kang ................ H01J 37/32091 156/345.51 |
| 2015/0373783 A1 | 12/2015 | Kitagawa | 
| 2017/0025254 A1 | 1/2017 | Tandou et al. |
| 2020/0135527 A1* | 4/2020 | Sung ................ H01J 37/32137 |

FOREIGN PATENT DOCUMENTS

| | | |
|---|---|---|
| JP | 2007201068 A | 8/2007 |
| JP | 2008172240 A | 7/2008 |
| JP | 2009021592 A | 1/2009 |
| JP | 2011009351 A | 1/2011 |
| JP | 3166974 U | 3/2011 |
| JP | 2011108764 A | 6/2011 |
| JP | 2012049166 A | 3/2012 |
| JP | 2012195463 A | 10/2012 |
| JP | 2013030693 A | 2/2013 |
| JP | 2015062237 A | 4/2015 |
| JP | 2016027601 A | 2/2016 |
| JP | 2017183700 A * | 10/2017 |
| KR | 10-2003-0038436 A | 5/2003 |
| KR | 10-2017-0012108 A | 2/2017 |
| KR | 10-2017-0113227 A | 10/2017 |

OTHER PUBLICATIONS

Office Action dated Jun. 29, 2021 in Japanese Application No. 2020-513354.

* cited by examiner

PLASMA PROCESSING APPARATUS

TECHNICAL FIELD

The present invention relates to a plasma processing apparatus such as a dry etching apparatus.

BACKGROUND ART

Regarding a plasma processing apparatus, in particular, the dry etching apparatus and the like, requirements related to an element shape of a semiconductor formed on a sample (hereinafter, referred to as a semiconductor wafer, or simply referred to as a wafer) are getting higher from year to year as the node width is reduced. In particular, among minute foreign objects in an etching apparatus, foreign objects that negatively affect the semiconductor are further micronized, so that it is required to reduce foreign objects in the etching apparatus. In a sample plate on which the semiconductor wafer is mounted and which electrostatically sucks the semiconductor wafer in the etching apparatus, in general, a radio-frequency wave of several kHz to several MHz is applied in order to realize anisotropic etching.

On the other hand, when an outermost circumferential portion of the semiconductor wafer comes into contact with the sample table, dust and the like attached to the outermost circumferential portion come into contact with the sample table and become the foreign objects described above, so that generally the sample table is designed to be smaller than the wafer and has a structure hidden from plasma by the wafer. Further, the outer circumference of the sample table is protected by providing a ring-shaped susceptor composed of ceramics, semiconductor, or the like to a portion overlapping with the wafer outside the sample table.

In the plasma processing apparatus having a general structure as described above, a gap is formed between an outer circumferential portion of the wafer and the susceptor, so that ions or radicals in the plasma flow through the gap and a side surface portion of the sample table is gradually worn. When, for example, worn objects are discharged inside a chamber and foreign objects occur or the wear reaches an electrode in the sample table, insulation breakdown or the like occurs, and this determines component life of the side surface portion of the sample table. It takes cost and maintenance time to replace the sample table, so that reduction of the number of replacement times of the sample table, that is, lifetime prolongation of the sample table, is one of conditions required for the dry etching apparatus.

Regarding damage of the side surface portion of the sample table, for example, Patent Literature 1 discloses a structure including a ring made of ceramics on the outside of the side surface portion of the sample table in order to suppress wear of the side surface portion of the sample table.

Further, Patent Literature 2 discloses a technique of electrostatically sucking a conductive susceptor and regulating temperature of the conductive susceptor by introducing a cooling gas.

CITATION LIST

Patent Literature

Patent Literature 1: Japanese Unexamined Patent Application Publication No. 2013-30693
Patent Literature 2: Japanese Unexamined Patent Application Publication No. 2015-62237

SUMMARY OF INVENTION

Technical Problem

In the Patent Literature 1 and Patent Literature 2 described above, a gap is formed between the outer circumferential portion of the wafer and the ring-shaped susceptor, so that ions or radicals in the plasma flow through the gap and the side surface portion of the sample table is damaged and gradually worn to generate foreign objects. Therefore, there occurs a problem that a manufacturing yield of semiconductor devices formed on the sample degrades.

When the sample table has a structure where a ring that protects the side surface portion of the sample table is provided, there occurs a problem where the size of the sample table decreases and temperature distribution in a wafer surface during plasma processing is degraded.

An object of the present invention is to provide a technique that can suppress generation of foreign objects from the side surface portion of the sample table and improve the manufacturing yield of semiconductor devices formed on the sample.

Another object of the present invention is to provide a technique that can suppress wear of the side surface portion of the sample table and prolong the lifetime of the sample table.

The other purposes and the new feature of the present invention will become clear from the description of the present specification and the accompanying drawings.

Solution to Problem

The following explains briefly the outline of a typical invention among the inventions disclosed in the present application.

Embodiments of a plasma processing apparatus of the present invention include a processing chamber in which a sample is processed by using plasma, a radio-frequency power supply that supplies radio-frequency power for generating the plasma, a sample table which is arranged in the processing chamber and in which the sample is mounted, and a first DC power supply which is electrically connected to the sample table and which causes the sample table to generate a suction force. Further, the sample table includes a protruded portion that sucks the sample by the suction force, a ring-shaped member provided outside the protruded portion and comprising a vertical portion arranged along an outer circumferential portion of the protruded portion, and upper end of the vertical portion being in contact with a lower surface of the sample when the sample is mounted on the sample table, a ring-shaped suscepter composed of a dielectric is provided outside the ring-shaped member, and in a state in which the sample is sucked to an upper surface of the protruded portion of the sample table, a space portion formed by the sample, the protruded portion, and the ring-shaped member is sealed.

Advantageous Effects of Invention

The following explains briefly the effect acquired by the typical invention among the inventions disclosed in the present application.

According to the present invention, it is possible to suppress generation of foreign objects from the side surface portion of the sample table and improve the manufacturing yield of semiconductor devices formed on the sample. Further, since it is possible to suppress generation of foreign objects from the side surface portion of the sample table, it is possible to suppress wear of the side surface portion of the sample table and prolong the lifetime of the sample table.

Furthermore, it is possible to equalize the temperature distribution in the wafer surface during plasma processing.

DESCRIPTION OF EMBODIMENTS

First Embodiment

Figure 1:
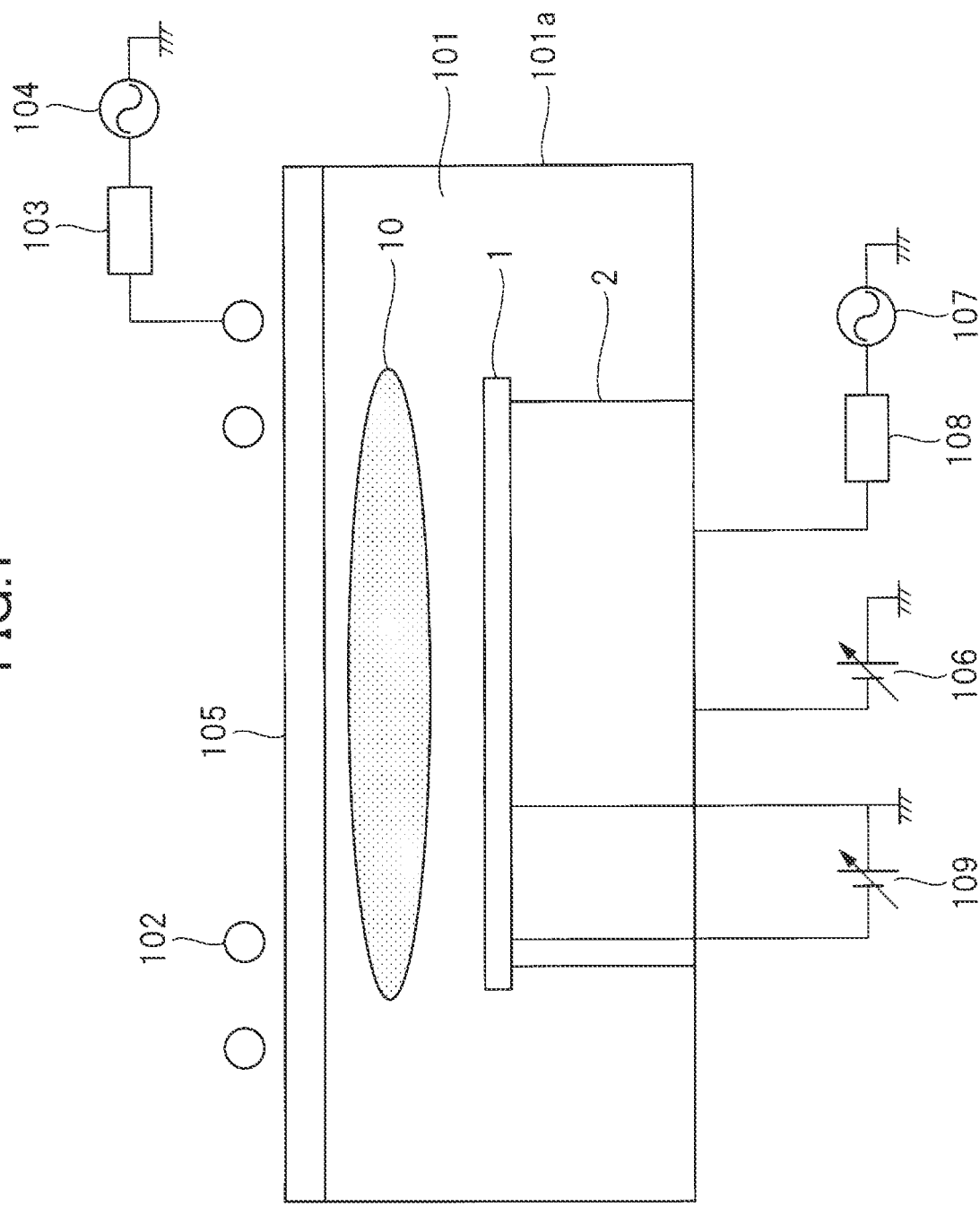
FIG. 1 is a schematic diagram showing a configuration of a plasma processing apparatus of a first embodiment of the present invention.

The first embodiment of the present invention will be described with reference to the drawings.

A plasma processing apparatus of the first embodiment will be described with reference to FIGS. 1 and 2.

In the first embodiment, a case will be described where a wafer 1 is used as a sample on which plasma processing is performed. In the plasma processing apparatus, a ring-shaped member is provided on an outer circumferential portion (outside) of a sample table 2, and the cooling gas that is introduced to a space portion 7 formed between the wafer 1 and the sample table 2 is sealed by tight adhesion between the ring-shaped member and the wafer 1 when the wafer 1 is sucked and held. Further, an example where an adhesive 6 is used to seal the space portion 7 between the ring-shaped member and the sample table 2 will be described.

The plasma processing apparatus of the first embodiment has a processing chamber 101 in which plasma processing is performed on a sample, the sample table 2 on which the wafer 1 is mounted and which doubles as an electrode, an antenna 102 to which a radio-frequency power for generating plasma is provided, a matching device 103, a radio-frequency power supply 104 for generating plasma, an DC power supply (first DC power supply) 106 for electrostatic suction, and a radio-frequency bias power supply 107. The sample table 2 is arranged in the processing chamber 101. The processing chamber 101 is evacuated to vacuum when the plasma processing is performed. The plasma processing apparatus includes a processing gas supply system not shown in the drawings. The processing gas supply system is connected to a chamber 101a which is a vacuum container having the processing chamber 101.

In the processing chamber 101 in the chamber 101a, to generate a plasma 10 by inductive coupling, a radio-frequency power is supplied to the antenna 102 from the radio-frequency power supply 104 for generating plasma through the matching device 103, the radio-frequency power is inductively coupled to processing gas supplied to the inside of the processing chamber 101 from the processing gas supply system through the window 105, and the processing gas is changed into plasma.

In the first embodiment, an inductively coupled type plasma processing apparatus is shown. However, regarding a method of generating the plasma 10, the plasma processing apparatus may be used for plasma 10 generated by other methods such as, for example, a capacitive coupling method or an ECR plasma method.

Figure 2:
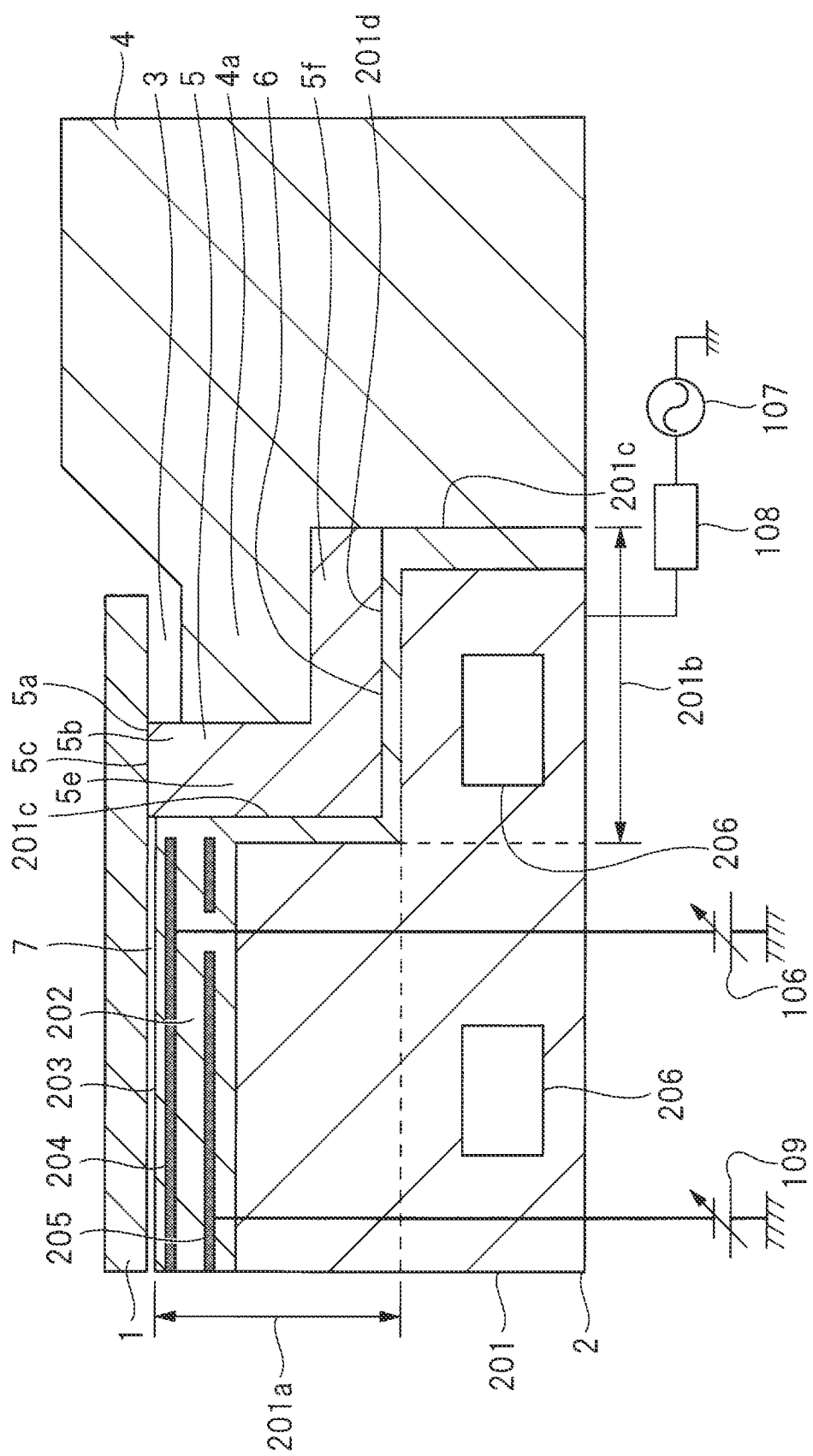
FIG. 2 is an enlarged partial cross-sectional view showing a structure near a side surface portion of a sample table of the plasma processing apparatus shown in FIG. 1.

As shown in FIG. 2, the sample table 2 that doubles as an electrode has a substrate portion 201 composed of a metal such as titanium or aluminum and a sprayed film 202 of ceramics such as alumina formed on a surface of the substrate portion 201. The sample table 2 further includes a protruded portion 201a that sucks the wafer 1 and a level different portion 201b protruding from a lower portion of the protruded portion 201a. Therefore, the sprayed film 202 is a dielectric film formed on a surface of each of an uppermost layer (upper surface) of the protruded portion 201a that sucks the wafer 1, a side surface portion 201c of the protruded portion 201a, and an upper surface and a side surface portion 201c of the level different portion 201b.

Inside the sprayed film 202, an electrostatic suction electrode 204 buried to obtain an electrostatic suction force (suction force) by a potential difference from the wafer 1 and a heater electrode 205 for controlling the sample table 2 to a predetermined temperature are formed. The heater electrode 205 is connected with a heater power supply 109 for supplying power to the heater electrode 205. Further, a refrigerant flow path 206 through which temperature-controlled refrigerant passes is provided inside the substrate portion 201 of the sample table 2.

The electrostatic suction electrode 204 of the sample table 2 is electrically connected with the DC power supply (first DC power supply) 106 for electrostatic suction. Therefore, when a voltage for electrostatic suction is applied to the electrostatic suction electrode 204 from the DC power supply 106, a potential difference is generated between the electrostatic suction electrode 204 and the sample table 2 and an electrostatic suction force can be generated in the protruded portion 201a of the sample table 2. Thereby, the wafer 1 can be sucked to the protruded portion 201a of the sample table 2. Specifically, the wafer 1 is sucked and held by a surface of the sprayed film 202 by a Coulomb force applied between the wafer 1 and the electrostatic suction electrode 204 through the sprayed film 202 or a Johnson-Rahbeck force (hereinafter also referred to as a JR force) generated by a surface current. At this time, it is possible to control the potential of the electrostatic suction electrode 204 to a voltage at which a preferred electrostatic suction force can be obtained by appropriately setting the DC power supply 106.

The electrostatic suction electrode 204 or the substrate portion 201 is connected with the radio-frequency bias power supply 107 of a frequency from 400 KHz to 13.56 MHz through a radio-frequency matching device 108, and an output from the radio-frequency bias power supply 107 can be applied to the wafer 1 through the sprayed film 202. It is possible to draw ions from the plasma 10 shown in FIG. 1 by the radio-frequency bias power supply 107 and process (manufacture) the wafer 1 to a desired shape. The substrate portion 201 is controlled to a desired temperature by the heater electrode 205 and the refrigerant flow path 206 and is maintained at a temperature preferable for the plasma processing.

Further, a gas groove 203 is provided on a surface of the sprayed film 202 in contact with the wafer 1, and the cooling gas such as He (helium) is introduced to the space portion 7 between the wafer 1 and the sprayed film 202 through the gas groove 203 by the cooling gas introduction mechanism not shown in the drawings. The cooling gas is a medium that promotes heat conduction between the wafer 1 and the sprayed film 202, and thereby it is possible to easily perform temperature control of the wafer 1.

The sample table 2 need not be a table formed by performing spaying on a metal. For example, the sample table 2 may be formed by burying an electrostatic suction electrode or the like into a ceramics such as alumina or aluminum nitride and sintering them.

Here, a plasma processing apparatus of a comparative example comparatively studied by the inventor will be described with reference to FIG. 3.

Figure 3:
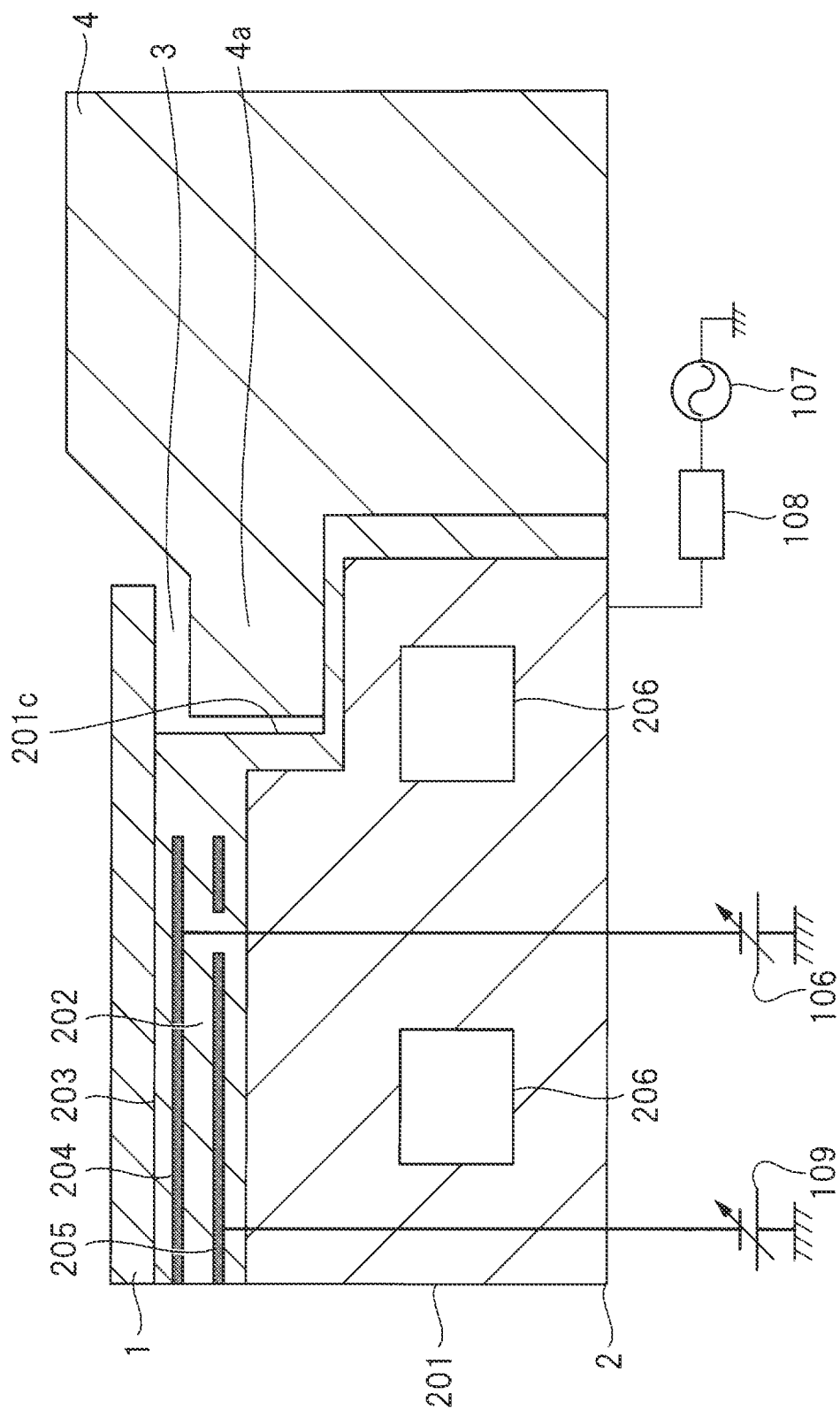
FIG. 3 is an enlarged partial cross-sectional view showing a structure near a side surface portion of a sample table of a plasma processing apparatus of a comparative example comparatively studied by the inventor.

In the plasma processing apparatus of the comparative example shown in FIG. 3, a ring-shaped susceptor 4 composed of a dielectric is arranged around the sample table 2 to protect the sample table (electrode) 2. A diameter of an inner circumferential wall of an inner circumferential portion 4a of the susceptor 4 is designed to be smaller than a diameter of the wafer 1. Therefore, in a state in which the wafer 1 is electrostatically sucked to the sample table 2, the wafer 1 covers an upper surface of the sample table 2 and a peripheral edge portion of the wafer 1 protrudes from the upper surface of the sample table 2. Thereby, a surface of the sample table 2 is not directly exposed to the plasma 10 shown in FIG. 1 during plasma processing.

However, in a structure as shown in FIG. 3, a gap portion 3 is formed in a portion surrounded by the sample table 2, the wafer 1, and the susceptor 4. The gap portion 3 is connected to a space where the plasma 10 is formed, and the gap portion 3 is exposed to the plasma 10. Further, a radio-frequency is applied to the sample table 2 in order to draw ions, so that positively charged ions in the plasma are drawn to the sample table (electrode) 2 and the ions hit the side surface portion 201c of the sample table 2. Thereby, the sprayed film 202 on the side surface portion 201c is sputtered, so that foreign objects may occur in the chamber and/or metal contamination may be caused. Alternatively, adhered objects that are adhered to the side surface portion 201c are also sputtered, so that foreign objects may be generated and/or metal contamination may be caused. Such foreign objects and metal contamination become a cause of hindrance of a desired operation of a semiconductor device in which microfabrication is advanced to an atomic layer level, so that yield degradation is caused in a semiconductor maker. Further, when sputtering of the side surface portion 201c proceeds with time, the sample table needs to be replaced at regular intervals, so that it becomes a cause of reduction in operating rate of the plasma processing apparatus.

As a material of surfaces (the upper surface and the side surface portion 201c) of the sample table 2, in an electrode using the Coulomb force, a sintered plate of a surface layer is adhered to the substrate portion 201 with adhesive, and spaying is often used for the side surface portion 201c. Also in an electrode using the JR force described above, in the same manner, there is a case where a sintered plate of a surface layer is adhered to the substrate portion 201 with adhesive and the spaying is used for the side surface portion 201c, and there is also a case where instead of the sintered plate, the sprayed film 202 whose resistivity is controlled is directly generated on the substrate portion 201.

In both cases, the side surface portion 201c has a structure where the sprayed film 202 is exposed. In a structure where the sintered plate is adhered, the adhesive under the sintered plate is exposed. It is possible to use a sintered plate, whose structure is stronger than the spraying and which is strong against sputtering, also for the side surface portion 201c. However, in this case, there is a problem that a heat capacity increases due to thickening and a surface temperature response degrades, and there is also a problem that the manufacturing cost of the sintered plate increases.

Therefore, the plasma processing apparatus of the first embodiment shown in FIGS. 1 and 2 has a countermeasure against damage caused by sputtering due to ion injection to the side surface portion 201c of the sample table 2.

in the plasma processing apparatus of the first embodiment shown in FIG. 2, an insulating ring (ring-shaped member) 5 which is composed of ceramics or the like and which can be in contact with a lower surface of the wafer 1 is provided on the outside of the outer circumference of the protruded portion 201a of the sample table 2 that doubles as an electrode. In other words, the insulating ring 5 is arranged so as to surround the protruded portion 201a on the outside of the protruded portion 201a. The ring 5 has a vertical portion 5e arranged along the outer circumferential portion of the protruded portion 201a of the sample table 2 and a flange portion 5f protruding from the vertical portion 5e. In other words, the ring 5 has a shape where the ring-shaped vertical portion 5e and the ring-shaped flange portion 5f are integrally formed. As shown in FIG. 2, a vertical cross section of the ring 5 has an L-shape.

The vertical portion 5e of the ring 5 is arranged along the outer circumferential portion of the protruded portion 201a of the sample table 2 and the flange portion 5f of the ring 5 is arranged on the level different portion 201b of the sample table 2. The ring 5 has a sample support portion 5b that can be in contact with the wafer 1 in the vertical portion 5e. An uppermost surface 5a (an upper surface arranged in the highest position) is formed on the sample support portion 5b. The uppermost surface 5a is a plane surface at the same height of a surface (upper surface) of the protruded portion 201a that generates an electrostatic suction force or a plane surface about 100 µm higher than the surface of the protruded portion 201a.

Therefore, the lower surface of the wafer 1 and the uppermost surface 5a of the ring 5 come into contact with each other in a state where the wafer 1 is sucked to the protruded portion 201a of the sample table 2 by the electrostatic suction force. Specifically, the ring 5 is arranged so as to surround the protruded portion 201a on the level different portion 201b of the sample table 2, and when the wafer 1 is electrostatically sucked to the sample table 2, the uppermost surface 5a of the sample support portion 5b of the ring 5 comes into contact with the lower surface of the wafer 1 and supports the wafer 1.

The ring-shaped susceptor 4 composed of a dielectric is provided outside the ring 5. Therefore, in a state in which the wafer 1 is sucked to the upper surface of the protruded portion 201a of the sample table 2, the peripheral edge portion of the lower surface of the wafer 1 and the sample support portion 5b of the ring 5 are in contact with each other and the inner circumferential portion 4a of the susceptor 4 overlaps with the peripheral edge portion of the wafer 1 in plan view.

In the plasma processing apparatus of the first embodiment, when the wafer 1 is held to the sample table 2 by the electrostatic suction, the lower surface of the wafer 1 is pressed against the uppermost surface 5a of the ring 5 by the electrostatic suction force, so that the space portion 7 formed by the sample table 2, the wafer 1, and the ring 5 is sealed. That is to say, the plasma processing apparatus has a structure that seals the cooling gas which is introduced to the space portion 7 in order to promote heat transfer.

The space portion 7 is sealed, so that the space portion 7 is filled with the cooling gas and it is possible to secure a state of heat transfer better than that in vacuum. Further, heat entering into the wafer 1 and the ring 5 from the plasma 10 can be exhausted to the sample table 2, so that it is possible to prevent the wafer 1 and the ring 5 from being excessively heated.

The inner circumferential portion 4a of the susceptor 4 is arranged over the flange portion 5f of the ring 5 on the level different portion 201b of the sample table 2. Thereby, it is possible to prevent the ring 5 from being damaged by the plasma 10 and prevent the temperature of the ring 5, whose heat capacity is larger than that of the wafer 1, from being largely fluctuated when the ring 5 directly receives heat from the plasma 10.

The cooling gas needs to be also sealed between the ring 5 and the sample table 2, so that in the first embodiment, the adhesive 6 is applied to a contact portion 201d between a lower surface of the flange portion 5f of the ring 5 and the level different portion 201b of the sample table 2 and the cooling gas is prevented from leaking from between the sample table 2 and the ring 5. That is, in a state in which the wafer 1 is sucked to the upper surface of the protruded portion 201a of the sample table 2, the sealed space portion 7 can be filled with the cooling gas. As a material of the adhesive 6, for example, a silicon-based adhesive 6 may be used, or an adhesive where the silicon-based adhesive 6 is coated with another adhesive 6 having high plasma resistance may be used.

The ring 5 is arranged on the level different portion 201b of the sample table 2, so that the sample table 2 is not exposed during plasma processing, and a sputtered portion is not the sample table 2 but the ceramic ring 5. Thereby, in the plasma processing apparatus of the first embodiment, resistance against sputtering of a sprayed portion of the side surface portion 201c of the sample table 2 is improved more than that of a portion where ceramics is fixed with adhesive on a surface of the susceptor 4 as compared with the plasma processing apparatus of the comparative example shown in FIG. 3, so that it is possible to prevent problems of foreign objects and contamination from occurring.

A material of the ceramics used for the ring 5 may be, for example, aluminum oxide (alumina), yttrium oxide (yttria), or quartz. For the material, it is preferable to use a material having high plasma resistance and it is possible to appropriately select a material according to the gas used for the plasma processing. Regarding a method of manufacturing the ring 5, it is preferable to process the ring 5 after integral baking instead of baking laminated sheets that are not baked in a manner like the surface of the sample table 2. Regarding a seal surface facing the wafer 1 (the uppermost surface 5a of the sample support portion 5b of the ring 5), when the surface roughness of the seal surface is Ra 0.4 or less and more preferably Ra 0.1 or less, the sealability of the space portion 7 can be further improved. The surface roughness of the upper surface of the protruded portion 201a of the sample table 2 is between Ra 0.6 and Ra 1.0.

According to the plasma processing apparatus of the first embodiment, the ring 5 is arranged outside the protruded portion 201a of the sample table 2, so that the side surface portion 201c of the sample table 2 is covered by the ring 5. Further, in a state in which the wafer 1 is sucked to the upper surface of the protruded portion 201a of the sample table 2, the space portion 7 formed by the wafer 1, the protruded portion 201a, and the ring 5 is sealed. Thereby, it is possible to prevent the plasma 10 from entering into the space portion 7. Therefore, it is possible to suppress damage received by the side surface portion 201c of the sample table 2 when the plasma 10 enters into the space portion 7.

Thereby, it is possible to suppress generation of foreign objects from the side surface portion 201c of the sample table 2. As a result, it is possible to improve a manufacturing yield of semiconductor devices formed on the wafer 1. Further, since it is possible to suppress generation of foreign objects from the side surface portion 201c of the sample table 2, it is possible to suppress wear of the side surface portion 201c of the sample table 2 and prolong the lifetime of the sample table 2.

Further, the uppermost surface 5a of the ring 5 becomes the contact portion 201d in contact with the wafer 1, so that it is possible to suppress rise of temperature of a wafer outer circumferential portion, which is concerned due to a fact that the sample table 2 is smaller than a sample table 2 of a conventional plasma processing apparatus.

Thereby, it is possible to equalize temperature distribution in a wafer surface during plasma processing.

Second Embodiment

Figure 4:
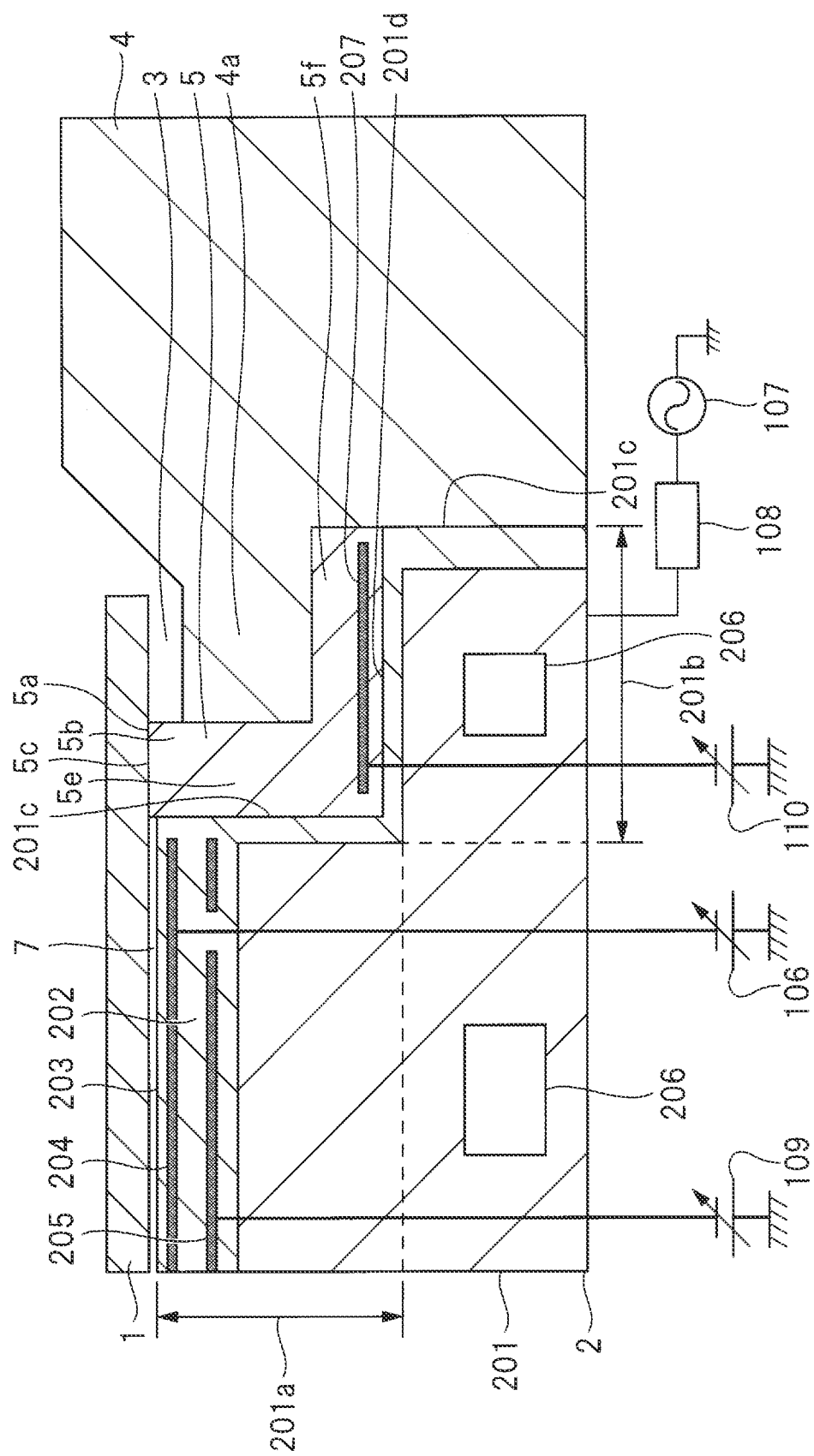
FIG. 4 is an enlarged partial cross-sectional view showing a structure near a side surface portion of a sample table of a plasma processing apparatus of a second embodiment of the present invention.

The second embodiment of the present invention will be described with reference to FIG. 4.

A basic structure of a plasma processing apparatus of the second embodiment shown in FIG. 2 is the same as that of the plasma processing apparatus of the first embodiment. However, a method of fixing the sample table (electrode) 2 and the ring 5 is different. Regarding the configuration of the first embodiment, a case in which the ring 5 and the sample table 2 are fixed by the adhesive 6 is described. In this case, when the ring 5 is worn and is required to be replaced, it is necessary to remove the sample table 2, further remove the ring 5, and adhere again the ring 5 with the adhesive 6.

On the other hand, the plasma processing apparatus of the second embodiment is characterized in that it has an electrostatic suction electrode 207 incorporated in the ring 5 so that only the ring 5 can be removed. The electrostatic suction electrode 207 is electrically connected to a DC power supply (second power supply) 110. That is, the plasma processing apparatus of the second embodiment includes the electrostatic suction electrode 207 incorporated in the ring 5 and the DC power supply 110 that is the second DC power supply electrically connected to the electrostatic suction electrode 207.

Thereby, when a predetermined voltage is applied to the electrostatic suction electrode 207 from the DC power supply 110 during plasma processing, the Coulomb force or the JR force is generated by a potential difference generated between the level different portion 201b of the substrate portion 201 and the electrostatic suction electrode 207, and the ring 5 is sucked to the sample table 2. That is, the ring 5 and the sample table 2 are tightly adhered to each other by an electrostatic suction force generated by a DC voltage applied to the electrostatic suction electrode 207 from the DC power supply 110. In a state in which the wafer 1 is sucked and held to the upper surface of the protruded portion 201a of the sample table 2, the sealed space portion 7 is filled with the cooling gas.

The surface roughness of the contact portion 201d between the ring 5 and the sample table 2 is desired to be set smaller than the surface roughness of a contact portion 5c between the ring 5 and the wafer 1, and a seal width of the contact portion 201d is desired to be longer than a seal width between the ring 5 and the wafer 1. In normal plasma processing, a leakage amount of cooling gas leaked from between the wafer 1 and the sample table 2 is monitored, and occurrence of abnormality is detected. Therefore, in the structure of the second embodiment, it is possible to reduce the leakage amount from between the ring 5 and the electrode 2 by monitoring the leakage amount of cooling gas leaked from between the ring 5 and the wafer 1, so that it is possible not to affect the monitoring of the leakage amount of the cooling gas.

As in the second embodiment, by employing a structure in which the electrostatic suction electrode 207 is incorporated in the ring 5 and the ring 5 and the sample table 2 are tightly adhered to each other by the electrostatic suction force generated by the DC voltage applied to the electrostatic suction electrode 207, the ring 5 may be only replaced when the ring 5 is worn. Thereby, it is possible to reduce maintenance cost of the plasma processing apparatus.

Third Embodiment

The third embodiment of the present invention will be described with reference to FIG. 5.

Figure 5:
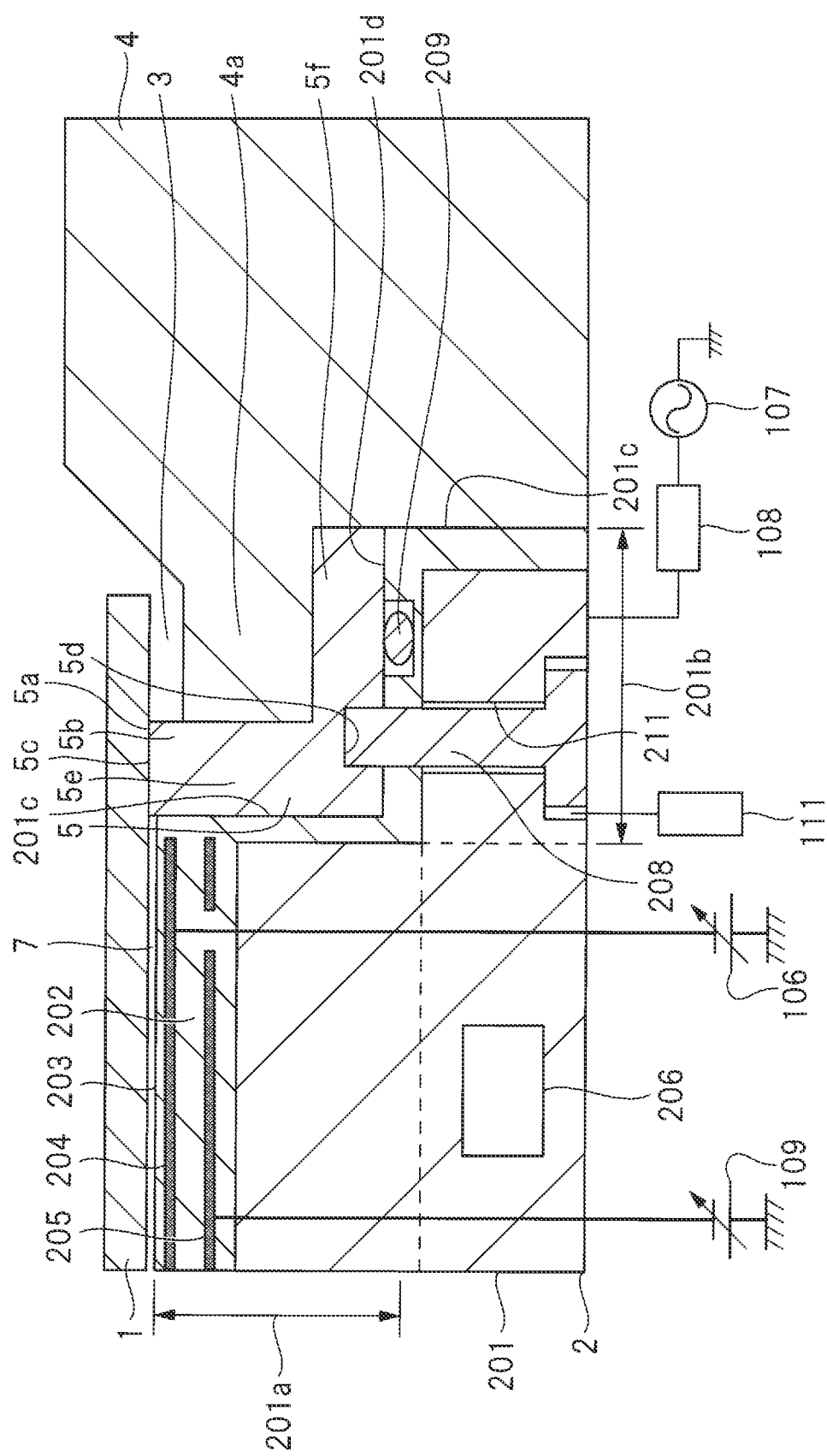
FIG. 5 is an enlarged partial cross-sectional view showing a structure near a side surface portion of a sample table of a plasma processing apparatus of a third embodiment of the present invention.

A basic structure of a plasma processing apparatus of the third embodiment shown in FIG. 5 is the same as that of the plasma processing apparatus of the first embodiment. However, a method of fixing the sample table (electrode) 2 and the ring 5 is different in the same manner as in the second embodiment.

In the method of fixing the sample table 2 and the ring 5 in the second embodiment described above, it is necessary to newly provide the sample table 2, so it is concerned that the cost of the ring 5 increases and the cost of the entire apparatus increases due to installation of the DC power supply 110.

Therefore, the third embodiment is characterized in that a member such as a metal having a screw hole 5d for fixation is buried in the ring 5 composed of ceramics, or the screw hole 5d is provided to the ceramics itself, the ring 5 and the sample table 2 are fixed by a fastening force of a bolt (screw) 208, and further the cooling gas is sealed by an O-ring 209 provided outside the bolt 208.

Specifically, the sample table 2 and the ring 5 are fastened together by the bolt 208 inserted from a lower side of the sample table 2 in a state in which the O-ring 209 is located on the contact portion 201d between the level different portion 201b of the sample table 2 and the flange portion 5f of the ring 5. In a state in which the wafer 1 is sucked to the upper surface of the protruded portion 201a of the sample table 2, the sealed space portion 7 sealed by the O-ring 209 is filled with the cooling gas. Further, the plasma processing apparatus shown in FIG. 5 includes a gas introduction portion 111 communicating with a screw hole 211 of the sample table 2 into which the bolt 208 is inserted, and the cooling gas is introduced to the space portion 7 through the screw hole 211. The plasma processing apparatus may include a gas introduction portion 111 communicating with the space portion 7 through a gap between the ring 5 and the sample table 2. In this case, the cooling gas is introduced to the space portion 7 from the gas introduction portion 111 through the gap between the ring 5 and the sample table 2.

For example, in the plasma processing apparatus of the comparative example shown in FIG. 3, the cooling gas is introduced from the surface of the sample table 2. However, in the plasma processing apparatus of the third embodiment, the cooling gas is introduced from the gas introduction portion 111 through the screw hole 211 of the bolt 208 and a region between the ring 5 and the sample table 2. At this time, the cooling gas between the wafer 1 and the sample table 2 is sealed by the contact portion 5c between the ring 5 of the outermost circumference and the wafer 1, so that in the same manner as in the plasma processing apparatus shown in FIG. 2, also in the plasma processing apparatus of the third embodiment shown in FIG. 5, the cooling gas can be introduced between the wafer 1 and the sample table 2, and further it is possible to prevent the structure of the surface of the sample table 2 from becoming complicated.

In the plasma processing apparatus of the comparative example shown in FIG. 3, the wafer 1 has a self-bias potential by a radio-frequency bias voltage. However, no self-bias occurs in the sample table 2, so that a potential difference corresponding to the self-bias potential occurs in a space of pressure of the cooling gas. Undesirable abnormal discharge may be generated by the potential difference and the pressure, so that yield may be degraded. Therefore, in the plasma processing apparatus of the comparative example shown in FIG. 3, it is necessary to secure a long creepage distance between the wafer 1 and a metal potion of the sample table 2, so that introduction holes with complicated shapes are formed by insulating ceramics or resin.

However, as in the plasma processing apparatus of the third embodiment, when the cooling gas is introduced from a gap between the ring 5 and the sample table 2, an area to which the cooling gas is introduced is away from the wafer 1, so that it is possible to secure a long creepage distance between the wafer 1 and the sample table 2. Thereby, the plasma processing apparatus of the third embodiment can introduce the cooling gas with a simpler structure as compared with the plasma processing apparatus of the comparative example shown in FIG. 3.

Fourth Embodiment

The fourth embodiment of the present invention will be described with reference to FIG. 6.

Figure 6:
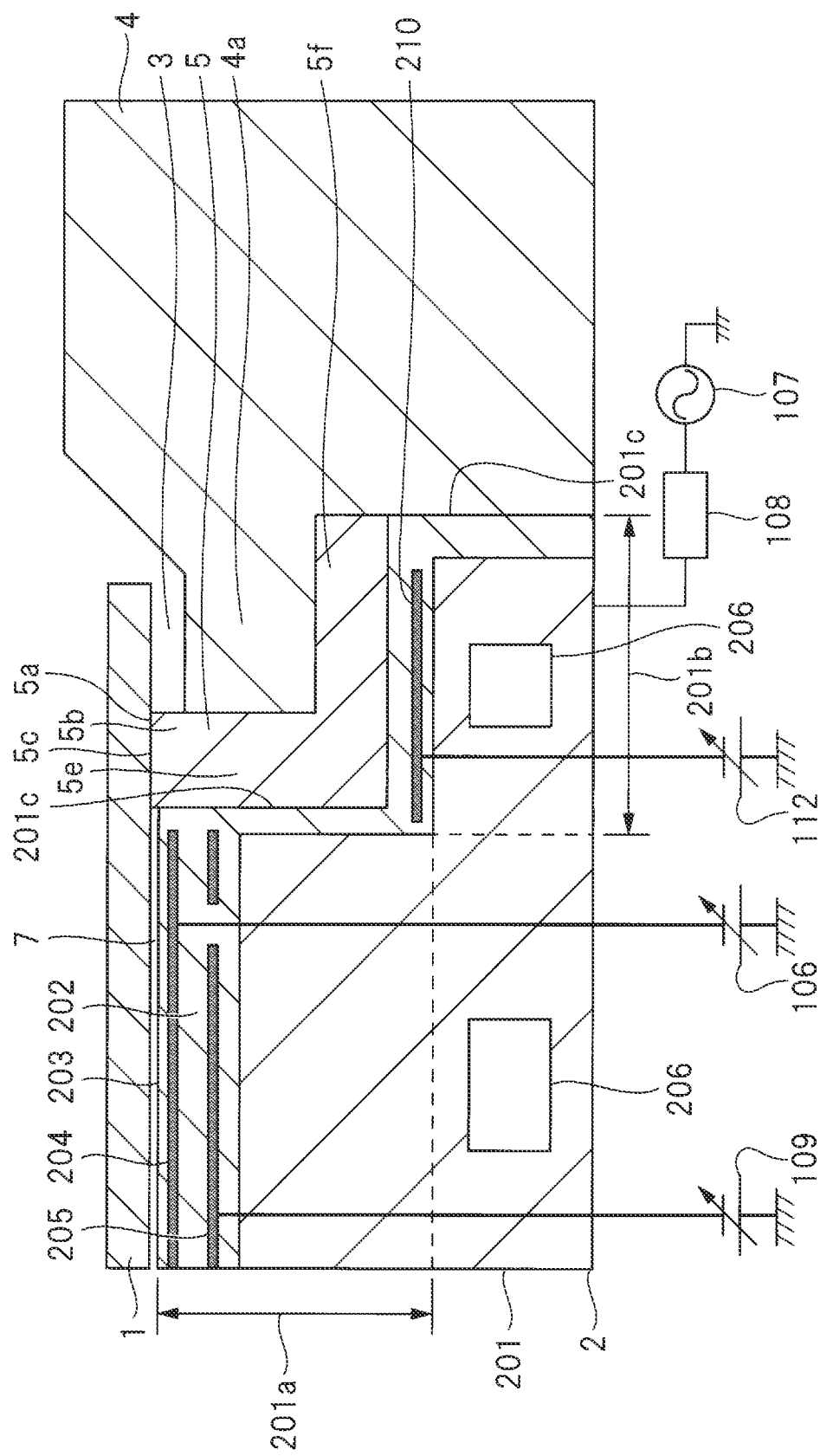
FIG. 6 is an enlarged partial cross-sectional view showing a structure near a side surface portion of a sample table of a plasma processing apparatus of a fourth embodiment of the present invention.

A basic structure of a plasma processing apparatus of the fourth embodiment shown in FIG. 6 is the same as that of the plasma processing apparatus of the first embodiment. However, the plasma processing apparatus shown in FIG. 6 is characterized in that it includes an outer circumference heater electrode 210 for temperature control in the level different portion 201b of the sample table 2 where the flange portion 5f of the ring 5 is mounted and further includes a heater power supply 112 electrically connected to the heater electrode 210.

Specifically, the heater electrode (heater) 210 is provided inside the sprayed film (dielectric film) 202 formed on the surface of the level different portion 201b of the sample table 2, and further the heater power supply 112 electrically connected to the heater electrode 210 is included.

The contact portion 5c between the outer circumferential portion of the wafer 1 and the ring 5 of the first to the third embodiments of the present invention and the contact portion between the wafer 1 and the ring 5 of the plasma processing apparatus of the comparative example shown in FIG. 3 have a structure in which the pressure of the cooling gas gradually decreases in a direction from the center to the outer circumference of the protruded portion 201a, and the temperature of the outer circumferential portion of the wafer 1 tends to rise because the wafer 1 is larger than the ring 5 or the sample table 2.

In this case, in the structure of the plasma processing apparatuses of the first to the third embodiments of the present invention, the heater electrode is not arranged on the contact portion 201d, so that the plasma processing apparatuses are heated more easily than the plasma processing apparatus of the comparative example shown in FIG. 3. On the other hand, the plasma processing apparatuses may be overcooled and the temperature of the outer circumferential portions of the wafers 1 may be specific. At this time, when the heater electrode 210 is provided below the flange portion 5f of the ring 5 as in the plasma processing apparatus of the fourth embodiment shown in FIG. 6 and a heating amount of the heater electrode 210 is adjusted, the temperature of the outer circumferential portion of the wafer 1 can be suitably controlled.

While the invention made by the inventor has been specifically described based on the embodiments of the invention, it is needless to say that the present invention is not limited to the embodiments of the invention and can be variously modified without departing from the scope of the invention.

The present invention is not limited to the embodiments described above and includes various modified examples. For example, the above embodiments are described in detail in order to describe the present invention in an easy-to-understand manner, and the embodiments are not necessarily limited to those that include all the components described above.

Further, some components of a certain embodiment can be replaced by components of another embodiment, and components of a certain embodiment can be added to components of another embodiment. Further, regarding some components of each embodiment, it is possible to perform addition/deletion/exchange of other components. Members and relative sizes described in the drawings are simplified and idealized in order to describe the present invention in an easy-to-understand manner, and the members have more complicated shapes in practice.

The plasma processing apparatus of the embodiments described above may be an apparatus in which the ring-shaped member and the susceptor 4 are integrated. That is, a susceptor composed of a dielectric may be provided as the ring-shaped member. The plasma processing apparatus in this case has a structure in which the susceptor has a sample support portion that can be in contact with the wafer 1, and the peripheral edge portion of the lower surface of the wafer 1 and the sample support portion of the susceptor are in contact with each other in a state in which the wafer 1 is sucked to the upper surface of the protruded portion 201a of the sample table 2.

LIST OF REFERENCE SIGNS 1 wafer (sample)
2 sample table
3 gap portion
4 susceptor
4a inner circumferential portion
5 ring (ring-shaped member)
5a uppermost surface
5b sample support portion
5c contact portion
5d screw hole
5e vertical portion
5f flange portion
6 adhesive
7 space portion
10 plasma
101 processing chamber
101a chamber
102 antenna
103 matching device
104 radio-frequency power supply
105 window
106 DC power supply (first DC power supply)
107 radio-frequency bias power supply
108 matching device
109 heater power supply
110 DC power supply (second DC power supply)
111 gas introduction portion
112 heater power supply
201 substrate portion
201a protruded portion
201b level different portion
201c side surface portion
201d contact portion
202 sprayed film (dielectric film)
203 gas groove
204 electrostatic suction electrode
205 heater electrode
206 refrigerant flow path
207 electrostatic suction electrode
208 bolt (screw)
209 O-ring
210 heater electrode (heater)
211 screw hole

The invention claimed is:

1. A plasma processing apparatus comprising:
a processing chamber in which a sample is processed by using plasma; a radio-frequency power supply that supplies radio-frequency power for generating the plasma; a sample table which is arranged in the processing chamber and in which the sample is mounted; and a first DC power supply which is electrically connected to the sample table and which causes the sample table to generate a suction force, wherein
the sample table includes a protruded portion that sucks the sample by the suction force,
a ring-shaped member provided outside the protruded portion and comprising a vertical portion arranged along an outer circumferential portion of the protruded portion, an upper end of the vertical portion being in contact with a lower surface of the sample when the sample is mounted on the sample table,
a ring-shaped susceptor composed of a dielectric is provided outside the ring-shaped member, and
in a state in which the sample is sucked to an upper surface of the protruded portion of the sample table, a space portion formed by the sample, the protruded portion, and the ring-shaped member is sealed.

2. The plasma processing apparatus according to claim 1, wherein
in a state in which the sample is sucked to the upper surface of the protruded portion of the sample table, a peripheral edge portion of the lower surface of the sample and the upper end of the ring-shaped member are in contact with each other and an inner circumferential portion of the susceptor overlaps with the peripheral edge portion of the sample in plan view.

3. The plasma processing apparatus according to claim 1, wherein
the sample table and the ring-shaped member are tightly adhered by an adhesive, and
in a state in which the sample is sucked to the upper surface of the protruded portion of the sample table, the sealed space portion is filled with a cooling gas.

4. The plasma processing apparatus according to claim 1, further comprising:
an electrostatic suction electrode incorporated in the ring-shaped member; and
a second DC power supply electrically connected to the electrostatic suction electrode, wherein
the ring-shaped member and the sample table are tightly adhered by a suction force generated by a DC voltage applied to the electrostatic suction electrode from the second DC power supply, and
in a state in which the sample is sucked to the upper surface of the protruded portion of the sample table, the sealed space portion is filled with a cooling gas.

5. The plasma processing apparatus according to claim 1, wherein
the sample table and the ring-shaped member are fastened together by a screw inserted from a lower side of the sample table in a state in which an O-ring is located on a contact portion between the sample table and the ring-shaped member, and
in a state in which the sample is sucked to the upper surface of the protruded portion of the sample table, the space portion sealed by the O-ring is filled with a cooling gas.

6. The plasma processing apparatus according to claim 1, wherein
the sample table includes a level different portion which protrudes from a lower portion of the protruded portion and on which the ring-shaped member is mounted, and
a heater is provided inside a dielectric film formed on a surface of the level different portion.

7. The plasma processing apparatus according to claim 1, further comprising:
a gas introduction portion communicating with the space portion through a gap between the ring-shaped member and the sample table, wherein
a cooling gas is introduced from the gas introduction portion.

8. The plasma processing apparatus according to claim 5, further comprising:
a gas introduction portion communicating with a screw hole of the sample table into which the screw is inserted, wherein
the cooling gas is introduced from the gas introduction portion.

9. The plasma processing apparatus according to claim 1, wherein
the ring-shaped member is composed of aluminum oxide, yttrium oxide, or quartz.

10. The plasma processing apparatus according to claim 1, wherein
a surface roughness of the upper surface of the protruded portion of the sample table is between Ra 0.6 and Ra 1.0, and
a surface roughness of a sample support portion which is part of the ring-shaped member and which is in contact with the sample is Ra 0.4 or less.

* * * * *